United States Patent [19]

Noguchi

[11] Patent Number: 5,289,016
[45] Date of Patent: Feb. 22, 1994

[54] THIN FILM TRANSISTOR WITH EXCELLENT STABILITY FOR LIQUID CRYSTAL DISPLAY

[75] Inventor: Kesao Noguchi, Tokyo, Japan
[73] Assignee: NEC Corporation, Tokyo, Japan
[21] Appl. No.: 690,418
[22] Filed: Apr. 24, 1991

[30] Foreign Application Priority Data
Apr. 24, 1990 [JP] Japan .................................. 2-108382

[51] Int. Cl.⁵ .................. H01L 29/04; H01L 31/036; H01L 23/58
[52] U.S. Cl. ........................................ 257/57; 257/59; 257/66; 257/72; 257/641; 359/59
[58] Field of Search ................ 357/2, 4, 23.7; 257/57, 257/59, 66, 72, 640, 641, 644, 650; 359/57, 58, 59

[56] References Cited

U.S. PATENT DOCUMENTS

| | | | |
|---|---|---|---|
| 4,821,092 | 4/1989 | Noguchi | 357/23.7 |
| 4,834,507 | 5/1989 | Kato et al. | 357/23.7 |
| 4,864,376 | 9/1989 | Aoki et al. | 357/23.7 |
| 4,997,262 | 3/1991 | Sakono et al. | 357/23.7 |
| 5,041,888 | 8/1991 | Possin et al. | 357/23.7 |
| 5,076,666 | 12/1991 | Katayama et al. | 357/23.7 |
| 5,103,330 | 4/1992 | Fukami et al. | 357/23.7 |

FOREIGN PATENT DOCUMENTS

| | | | |
|---|---|---|---|
| 1-276767 | 11/1989 | Japan | 357/23.7 |
| 1-276768 | 11/1989 | Japan | 357/23.7 |

OTHER PUBLICATIONS

M. Sasuga et al, "10.4-In. Diagonal Multicolor Display Using Amorphous Silicon TFT-LCD", Symposium of Japan Display '89, pp. 510-513.
Y. Asai, "A 6.7-In. Square High-Resolution Full-Color TFT-LCD", Symposium of Japan Display '89, pp. 514-517.

*Primary Examiner*—Rolf Hille
*Assistant Examiner*—Steven Loke
*Attorney, Agent, or Firm*—Sughrue, Mion, Zinn, Macpeak & Seas

[57] ABSTRACT

The thin-film transistor for liquid crystal display according to the present invention has an inverted-staggered structure in which source and drain electrodes are formed above a gate electrode on a glass substrate, and comprises a nondoped amorphous silicon film as a channel region just above the gate electrode, and a borosilicate glass film formed on the amorphous silicon film. Preferably, the transistor further includes a silicon nitride film formed over the borosilicate glass film.

12 Claims, 2 Drawing Sheets

THIN FILM TRANSISTOR WITH EXCELLENT STABILITY FOR LIQUID CRYSTAL DISPLAY

BACKGROUND OF THE INVENTION

1. Field of the Invention

The present invention relates to a field effect transistor for liquid crystal display, and more particularly to an inverted-staggered type field effect transistor with excellent stability for liquid crystal display.

2. Description of the Related Art

In recent years, active matrix type liquid crystal display in which thin-film transistors are used as switching elements occupies an increasingly higher percentage of liquid crystal displays. Thin-film transistors used generally for this purpose are of amorphous silicon type which can be fabricated at low temperatures on a large area glass substrate. Besides, many of such amorphous silicon thin-film transistors (a-SiTFT) have the so-called inverted staggered structure in which source and drain electrodes are formed above a gate electrode.

FIG. 1 illustrates in cross-sectional view an example of a thin-film transistor for liquid crystal display element in the prior art (See Symposium of JAPAN DISPLAY '89, p. 516, FIG. 4).

As shown in FIG. 1, a gate electrode 2 is formed on a glass substrate 1. The gate electrode 2 is made of an alloy of Mo and Ta. The gate electrode 2 and the glass substrate 1 are covered with a deposited gate oxide film 3 of silicon oxide ($SiO_2$). An undoped amorphous silicon film 4 is selectively formed on the gate oxide film 3 above the gate electrode 2. An $n^+$-type amorphous silicon film 5 is formed on the amorphous silicon film 4. Besides, on the gate oxide film 3, a pixel electrode 6 of indium-tin oxide (ITO) is also formed in a selected area except the area just above the gate electrode 2. There is further a pair of source and drain (Mo film 7a and Al film 8) electrodes formed in specified patterns by sequential deposition of Mo film 7a and Al film 8 over the whole resultant surface and then etching away to selectively remove them. The source and drain regions ($n^+$ amorphous silicon film 5) are patterned by selectively removing the $n^+$-type amorphous silicon film 5 between the source and drain electrodes (in the area just above the gate electrode). At the top, there is a passivation film 9 of silicon nitride ($SiN_x$) deposited except the pixel electrode 6. Finally, a liquid crystal 14 is inserted between the glass substrate 1 and an opposite electrode 13 formed on an opposite glass substrate 12 to form a liquid crystal display.

In a thin-film transistor for liquid crystal display having such inverted-staggered structure as described above, the so-called back channel region which is between the source and drain regions 5 and is opposed to the gate electrode is formed with its surface upward, and $SiN_x$ film 9 formed thereon as a passivation film works as a barrier to the $Na^+$ ions.

In the above-described conventional thin-film transistor for liquid crystal display, a problem is encountered that when $SiN_x$ film 9 is formed on a nondoped amorphous silicon film 4 containing a large amount of hydrogen, there is a tendency to generate fixed charges on the back-channel side of amorphous silicon film 4, which may cause an increase in an OFF current between the source and drain regions and/or a change in the threshold voltage, resulting in changing the characteristics of the transistor.

SUMMARY OF THE INVENTION

It is, therefore, a major object of the present invention to provide a thin film transistor having an excellent stability in transistor characteristics.

The thin film transistor according to the present invention comprises a gate electrode, a semiconductor layer formed above or on the gate electrode, a source electrode and a drain electrode formed above or on the semiconductor layer, a borosilicate glass film formed on the semiconductor layer between the source and drain electrodes. The thin film transistor according to the present invention preferably further comprises a silicon nitride film formed on the borosilicate glass film. The thin film transistor according to the present invention preferably still further comprises a gate insulating film formed between the gate electrode and the semiconductor layer.

The semiconductor layer is preferably a noncrystallized silicon film. The noncrystallized silicon film is preferably an amorphous silicon film. The amorphous silicon film is preferably a nondoped amorphous silicon film. The thin film transistor according to the present invention preferably still further comprises $n^+$ amorphous silicon layers between the nondoped amorphous silicon films and the source electrode and between the nondoped amorphous silicon film and the drain electrode.

According to the present invention, the borosilicate glass (BSG) film is used as a passivating film for the thin-film transistor for liquid crystal display of the inverted-staggered structure. Thus the amorphous silicon film between the source and drain electrodes is covered with a BSG film deposited thereon. This is distinguished from the SiNx film in the prior art in the respect that the level established at the interface between the BSG film and the amorphous silicon film can be compensated by the action of boron contained in the BSG film, resulting in suppressed generation of fixed charges on the back channel region side, and thereby in suppressed increase in OFF current and reduced change in ON-current threshold voltage. This contributes to improvement in stability of transistor characteristics. The BSG film therefore is very useful as a passivating film for a thin-film transistor for liquid crystal display containing the amorphous silicon layer.

In a preferred embodiment of the present invention, combination of the BSG film and a silicon nitride ($S_iN_x$) film deposited thereon is used for passivation and in addition works as an improved barrier to the $Na^+$ ions, thereby attaining more stabilized elements.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

First Embodiment

Figure 1:
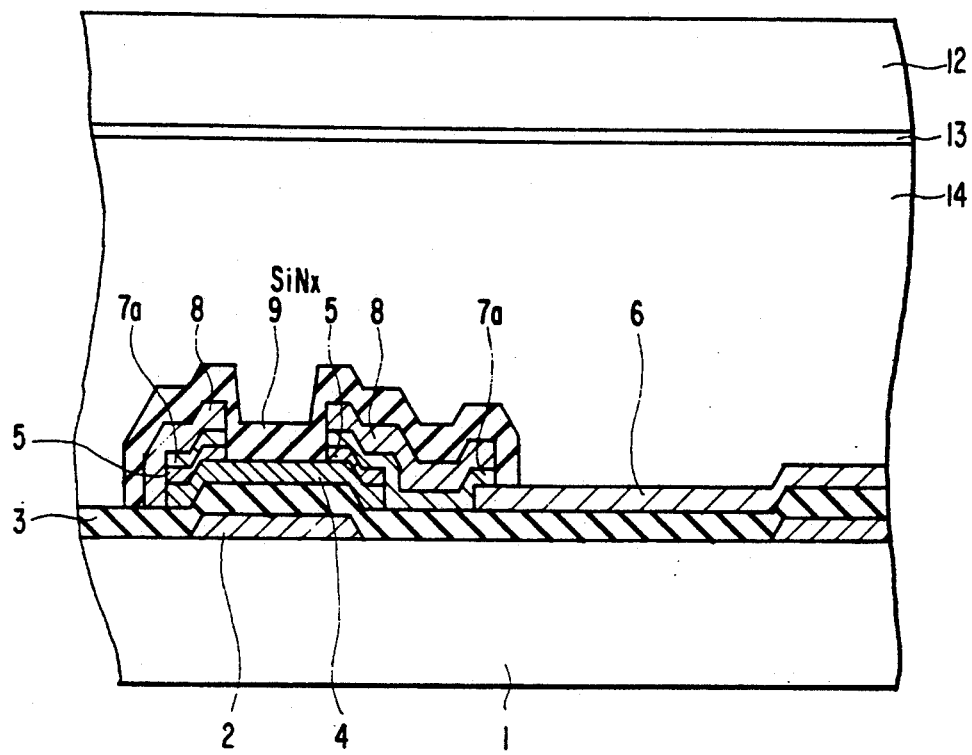
FIG. 1 is a sectional view for explaining a thin-film transistor of the prior art for a liquid crystal display.
Figure 2:
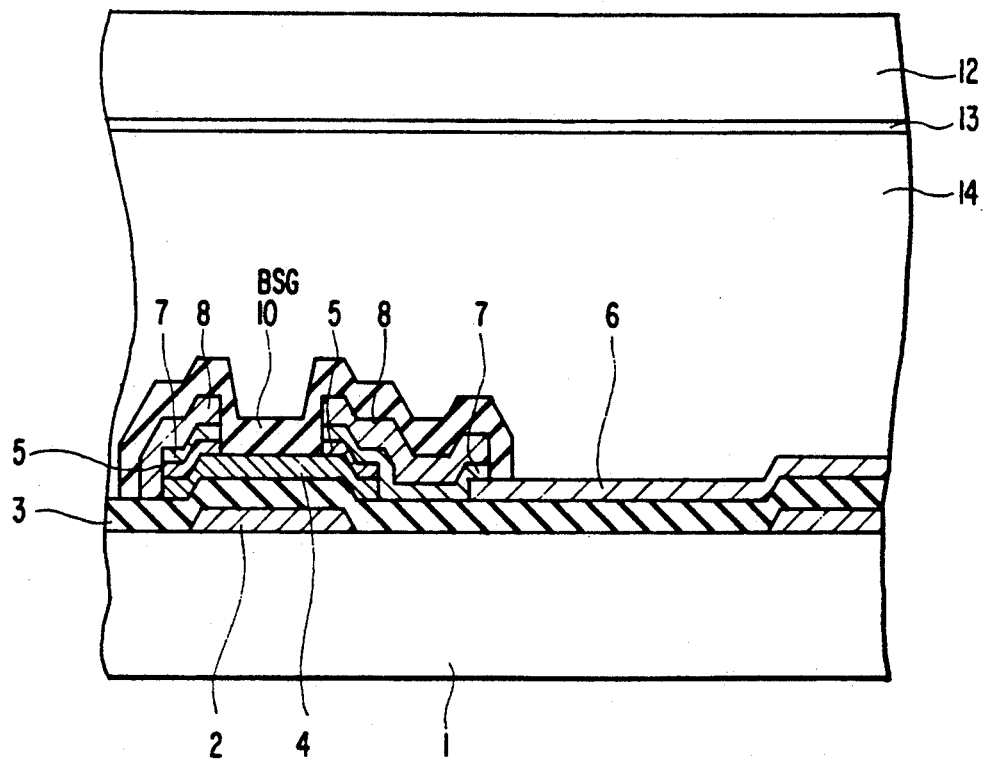
FIG. 2 is a sectional view for explaining a first embodiment of the present invention.

Referring to FIG. 2, onto a glass substrate 1 was deposited a chromium (Cr) film having a thickness of about 1500 Å, which was selectively removed to pattern a gate electrode 2. To cover the gate electrode 2 and glass substrate 1, a gate insulating film 3 of a SiNx film of about 3000 Å thickness is deposited by plasma CVD technique. A nondoped amorphous silicon film 4 of about 3000 Å thickness was formed on the gate insulating film 3 and then an $n^+$-type amorphous silicon film 5 of about 300 Å thickness was formed over the nondoped amorphous silicon film 4. These films were etched away selectively so as to leave the area to be formed into an intended transistor, which consists of the area just above the gate electrode 2 and the surrounding area. Besides, a pixel electrode 6 of ITO was formed on a selected area of the gate-insulating film 3. Over the resultant whole surface, a Cr film 7 was deposited to a thickness of about 1000 Å. Similarly an Al film 8 was formed to a thickness of about 5000 Å over the Cr film 7. These films were selectively etched away to be patterned into a pair of source and drain electrodes, one of which was connected to the pixel electrode 6. Further the $n^+$-type amorphous silicon film 5 between the source and drain electrodes, that is the area just above the region of gate electrode 2, was selectively removed to form source and drain regions 5. Additionally a passivating borosilicate glass (BSG) film 10 was desposited to a thickness of about 7000 Å over the whole resultant surface by a plasma CVD technique and then selectively etched away from the area over the pixel electrode 6, thus to cover the area above gate electrode 2 and the source and drain electrode regions. The plasma CVD was carried out by using a mixed gas of diborane, silane and oxygen.

Finally, a liquid crystal 14 is inserted between the glass substrate 1 and an opposite electrode 13 formed on an opposite glass substrate 12 to form a liquid crystal display.

In the thin-film transistor for liquid display constructed as described above, distinguishing from the use of only the passivating film of SiNx as in the prior art, there was found neither increase in the OFF current nor the shift in the threshold voltage. In the prior art it may be considered that the amorphous silicon film-SiNx film junction in the back channel region between the source and drain electrodes causes a tendency to generate fixed charges, the influence of which appears on the channel region side. It may be further considered that particularly the residue of phosphorus after the removal of $n^+$-type amorphous silicon film by etching and/or nitrogen contained in the SiNx film is probable to be diffused into the surface of the nondoped amorphous silicon film, and hence these impurities would establish a level at the interface between the nondoped amorphous silicon film and the SiNx film, resulting in the generation of the fixed charges.

On the other hand, in the case of the present embodiment, the level established at the interface between BSG film 10 and amorphous silicon film 4 can be compensated by the action of boron, which makes difficult the generation of fixed charges on the back channel region side of amorphous silicon film 4, contributing to improvement in stability of transistor characteristics. Thus BSG film is excellent as a passivating film for the thin-film transistor for liquid display containing amorphous silicon film.

Second Embodiment

Figure 3:
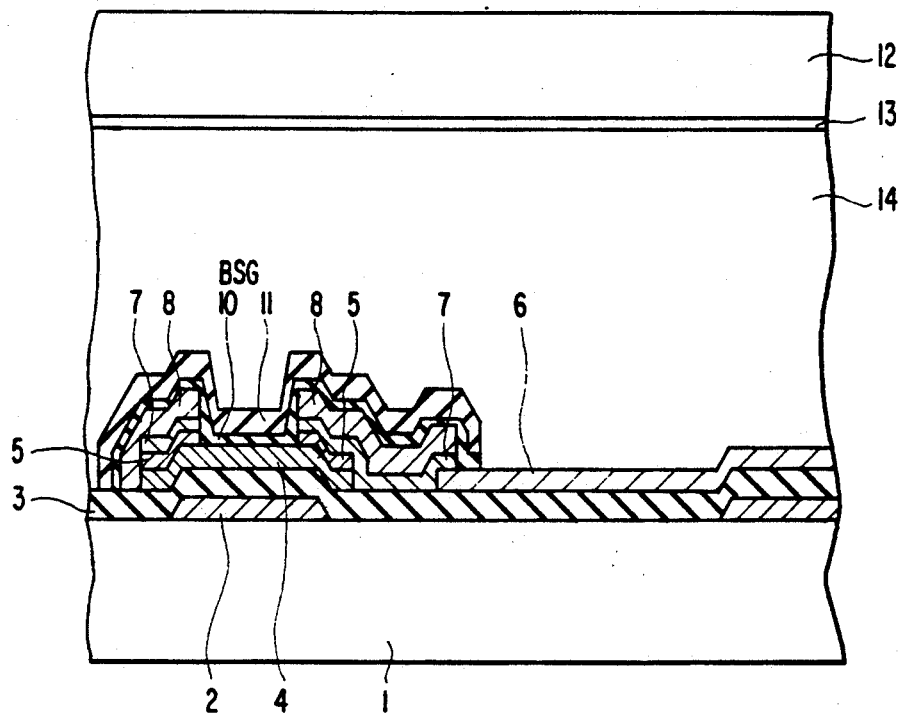
FIG. 3 is a sectional view for explaining a second embodiment of the present invention.

Referring to FIG. 3 corresponding parts in FIG. 3 to those in FIG. 2 are designated with the same reference characters as in FIG. 2, and therefore description of them are omitted.

In this embodiment, for passivation were formed a BSG film 10 of about 500 Å thickness, followed by thereon a SiNx film 11 of about 5000 Å thickness. This combination of BSG film 10 and SiNx film 11 has, in addition to the same effect as that in the first embodiment, enhanced barrier property to the $Na^+$ ions, enabling to realize elements having higher stability.

Third Embodiment

Figure 4:
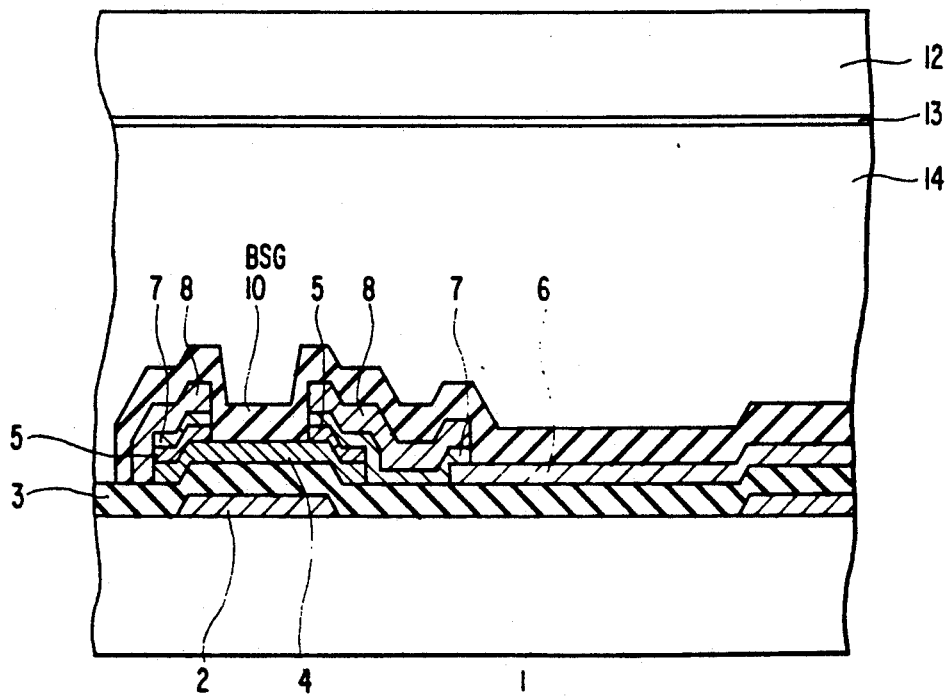
FIG. 4 is a sectional view for explaining a third embodiment of the present invention.

Referring to FIG. 4, corresponding parts in FIG. 4 to those in FIG. 2 are designated with the same reference characters as in FIG. 2, and therefore description of them are omitted.

In this embodiment, a BSG film 10 of about 1000 Å was formed over the whole surface except the terminal portion (not shown) of the liquid crystal display. In addition to the same effect as that of the first embodiment, the coverage of the pixel electrode 6 with the BSG film 10 can prevent the liquid crystal from being contaminated with impurities during processing resulting in higher reliability of the element.

What is claimed is:

1. A thin film transistor, comprising:
   a gate electrode;
   a semiconductor layer formed on said gate electrode;
   a source electrode and a drain electrode formed on said semiconductor layer;
   a borosilicate glass film formed on said semiconductor layer and said source and drain electrodes; and
   a silicon nitride film formed on said borosilicate glass film.

2. A thin film transistor as recited in claim 1, further comprising a gate insulating film formed between said gate electrode and said semiconductor layer.

3. A thin film transistor as recited in claim 2, wherein said semiconductor layer is a noncrystallized silicon film.

4. A thin film transistor as recited in claim 3, wherein said semiconductor layer is an amorphous silicon film.

5. A thin film transistor as recited in claim 4, wherein said semiconductor layer is a nondoped amorphous silicon film.

6. A thin film transistor as recited in claim 5, further comprising an $n^+$ amorphous silicon layer formed between said nondoped amorphous silicon film and said source electrode and between said nondoped amorphous silicon film and said drain electrode.

7. A liquid crystal display, comprising:
   a plurality of pixel electrodes and a plurality of thin film transistors respectively connected to said pixel electrodes, wherein each of said thin film transistors includes:
   a gate electrode;
   a semiconductor layer formed on said gate electrode;
   a source electrode and a drain electrode formed on said semiconductor layer;

a borosilicate glass film formed on said semiconductor layer and said source and drain electrodes; and a silicon nitride film formed on said borosilicate glass film.

8. A liquid crystal display as recited in claim 7, wherein each of said thin film transistors further comprising a gate insulating film formed between said gate electrode and said semiconductor layer.

9. A liquid crystal display as recited in claim 8, wherein said semiconductor layer of each of said thin film transistors is a noncrystallized silicon film.

10. A liquid crystal display as recited in claim 9, wherein said semiconductor layer of each of said thin film transistors is an amorphous silicon film.

11. A liquid crystal display as recited in claim 10, wherein said semiconductor layer of each of said thin film transistors is a nondoped amorphous silicon film.

12. A liquid crystal display as recited in claim 11, wherein each of said thin film transistors further comprising an $n^+$ amorphous silicon layer formed between said nondoped amorphous silicon film and said source electrode and between said nondoped amorphous silicon film and said drain electrode.

* * * * *